United States Patent [19]
Kraz

[11] Patent Number: 5,773,974
[45] Date of Patent: Jun. 30, 1998

[54] PORTABLE ELECTRO-MAGNETIC FIELD DETECTION AND MEASUREMENT APPARATUS FOR NEAR-FIELD TEST AND MEASUREMENTS

[75] Inventor: Vladimir Kraz, Santa Cruz, Calif.

[73] Assignee: Credence Technologies, Inc., Santa Cruz, Calif.

[21] Appl. No.: 421,802

[22] Filed: Apr. 13, 1995

[51] Int. Cl.$^6$ .......................... G01R 33/02; G01R 29/08; G01R 13/00

[52] U.S. Cl. .......................... 324/258; 324/260; 324/133; 340/600

[58] Field of Search ................................ 324/258, 260, 324/133, 67, 72, 72.5, 95, 119, 120, 127, 149, 244, 251, 344, 345; 340/551, 600, 815.4, 326, 547; 250/250; 455/226.2, 226.4

[56] References Cited

PUBLICATIONS

Hewlet–Packard Data Sheet For HP8590 Spectrum Analyzer (1994 Catalog, pp. 242 & 244).
EMCO Data Sheet For 7405 Probe Kit (1994 Catalog, p. 18).

*Primary Examiner*—Walter E. Snow
*Assistant Examiner*—Jay M. Patidar
*Attorney, Agent, or Firm*—LaRiviere, Grubman and Payne

[57] ABSTRACT

Apparatus for detection of the electro-magnetic field and measurement of its strength in the near field. The apparatus includes an antenna suited to receive specified type of the electro-magnetic field; a detector to convert received signal into DC voltage, a summing device and a potentiometer to set the reference level, a DC amplifier for amplification of resulting signal. The apparatus further includes a voltage-controlled oscillator and a speaker that produces an audible tone with the pitch proportional to the field strength. The apparatus further includes a squelch circuit that blocks the sound when the field strength gets lower than the preset range. The apparatus further includes LED level bar as visual means of indicating field strength. The apparatus is constructed as a fully self-contained unit needing no additional equipment for its operation.

11 Claims, 4 Drawing Sheets

PORTABLE ELECTRO-MAGNETIC FIELD DETECTION AND MEASUREMENT APPARATUS FOR NEAR-FIELD TEST AND MEASUREMENTS

BACKGROUND-FIELD OF INVENTION

This invention relates to electronic devices, especially to test and measurement instrument for use in detection and measuring strength of the electro-magnetic fields.

BACKGROUND-DESCRIPTION OF PRIOR ART

In most countries, no electronics product may be sold unless it complies with the requirements of the local governmental EMC (Electro-Magnetic Compliance) agency. Many previously exempt industries, such as medical, etc., now have to enter the world of compliance. The radiated EMI (Electro-Magnetic Interference) compliance test is clearly defined in FCC p. 15 and many other international and military standards and regulations. The specifics vary slightly, but the principle is the same: the product under test is placed at some distance from the well-defined antenna and the amount of radiation is measured across the required frequency band. In other words, the measurements are done in the far, field. Testing in the far field means that the receiving antenna is placed at a sufficient distance from the product under test where the radiation irregularities resulting from the product's complex geometry are added together and are measured as a whole. In essence, the far field test can tell whether the product passes or fails as a whole but it cannot point the source of a problem. Using only the farfield test, one cannot tell whether an opening in the metal enclosure "leaks" too much radiation or a cable connected to the product carries too much RF (radio-frequency) energy that gets radiated.

In order to locate the source of the problem, electronic assemblies need "close up" inspection. Unfortunately, farfield antennae won't be able to help they are just too big. The right tool is called a near-field probe. It can identify the exact sources of emissions down to a component or a trace on the printed circuit board. With its help the whole product can be scanned in a matter of minutes and the leaks and problematic areas can be identified on the spot.

The disadvantage of the near-field probe is that there is very little correlation between near-field and farfield measurements. This is due to the complex geometry and uneven radiation patterns of the tested product. However, one thing is certain: the higher the radiation level in the near field, the higher it is in the far field. Therefore, tests performed in the near field give designers a "feel" of how the product will behave in the far field test. The near-field test can "map" the electro-magnetic field around the product, easily identifying spots with high radiation levels. Designers can then make changes to either eliminate or contain the emissions.

Other industries, such as design and maintenance of radio-frequency and TV equipment, industrial equipment, etc., require electro-magnetic field measurement as well.

A typical equipment used for measurement of EM (Electro-Magnetic) fields today is a spectrum analyzer equipped with a collection of antennae designed to receive different types of fields. Such analyzers provide onscreen readings of the magnitude of received field. An example of such equipment is 8590 series of spectrum analyzers (see attached Appendix 1) and antennae kit model 7405 by EMCO (see Appendix 2). Other manufacturers produce and sell similar devices that are very close in construction and in operation.

Though spectrum analyzers in conjunction with the appropriate antennae provide all or most of the utilities needed for adequate measurement of the electro-magnetic fields, in some applications many of their utilities go unused. In the near field, for example, absolute numbers displayed by spectrum analyzer bear little relevance to the actual EMC performance of the product.

Though spectrum analyzer in conjunction with the antennae set provide good functionality, has certain disadvantages:

a) high cost. The starting price for a lowestgrade HP spectrum analyzer model 8590D is $9000, as seen in Appendix 1. The antennae set from EMCO costs $500. This makes it impractical for an average engineer or technician to have it for his or her own use without constant sharing with the coworkers. For the near-field test this is especially pronounced.

b) difficulty in use. The typical setup requires special training and study of user's guide (the HP8590 user's guide for EMC measurements consists of three volumes). That means that only trained specialist is capable of properly operating such equipment and that an average engineer or technician needs to go through training prior to use of such equipment.

c) stationary operation. Spectrum analyzers with the assortments of the antennae are not suited for portable operation. They require dedicated space on the bench and cannot be easily moved. Use of spectrum analyzers in the field is impractical. There is no truly portable equipment available for detecting and measurement of EM field.

d) cords. Antennae are connected to the spectrum analyzer via cords. This means that the user has to point an antenna at one place and to read the results of the measurements in another place. This makes it difficult to do realtime measurements. It also results in a "twisted neck" syndrome, where the user has to constantly rotate head simultaneously to assure correct position of an antenna and to read the data from the screen. It specifically relates to the near field measurements since the tested product needs to be "mapped" as far as emitted field is concerned.

e) near-field probes require to have spectrum analyzer or other separate device to present the data. No fully selfcontained near-field measurement apparatus is available on the market.

Most users, therefore, would find it desirable to have a tool suited for the near-field measurements without the disadvantages of the conventional equipment.

OBJECTS AND ADVANTAGES

An objective of this invention is to provide an inexpensive, easytouse, portable and fully selfcontained tool that can detect and measure relative strength of the electro-magnetic field in the near field. A corollary advantage of such tool is that it can be afforded for personal use, both by its cost and size, thus providing better quality products and processes wherever this tool is used, saving money on electro-magnetic compliance test and reducing timetomarket for manufacturers of the electronics equipment.

Further objective and advantages of the invention will be found from consideration of the ensuing description and the accompanying drawings.

SUMMARY OF THE INVENTION

The present invention provides a selfcontained apparatus for detecting the presence of the electro-magnetic field and for measurement of its relative strength. Though this apparatus can be used for variety of fieldmeasurement needs, it was specifically adapted for the near-field measurements.

The apparatus is specifically designed to be fully self-contained and portable (pocket-sized) so that neither other equipment nor cords is needed for its operation. In addition, the apparatus contains minimum controls so that it is extremely easy to use and requires almost no training.

The apparatus includes a built in antenna, a signal amplifier and a detector. Depending on the type of the measured field, the antenna can be specifically suited for an electric field (a monopole antenna), or for the magnetic field (a inductive coil). Optional signal amplifier provides necessary gain for weak signals.

The voltage from the detector controls frequency of the voltage-controlled oscillator (VCO) which feeds the speaker. The output of the speaker is thus a continuous tone with the pitch that is a function of a field strength—the stronger the field, the higher the pitch of the tone. Since human ear is extremely sensitive to the pitch of the tone, the slightest changes of the field strength can be observed.

In addition, the apparatus has level control that changes the reference voltage for the VCO so that the user can change the field strength corresponding to the particular frequency of the VCO thus allowing for measurement of electro-magnetic fields of various strengths.

In addition, the apparatus includes squelch function that disables signal to the speaker when the field strength falls below preset level.

Further, the apparatus includes LED level bar that provides visual indication of the field strength.

The preferred embodiment of the apparatus has only three controls—power switch, level control potentiometer and sound On/Off switch. It is easy to use, requires virtually no training and, in its current implementation, weighs approximately 2 oz. Its retail cost is only $140 that in comparison to $10,000 for the spectrum analyzer setup, makes it affordable for any business.

BRIEF DESCRIPTION OF THE DRAWINGS

A written description setting forth the best mode presently known for carrying out the present invention, and of the manner of implementing and using it, is provided by the following detailed description of an illustrative embodiment in the attached drawing figures wherein.

DETAILED DESCRIPTION OF AN ILLUSTRATIVE EMBODIMENT

Figure 1:
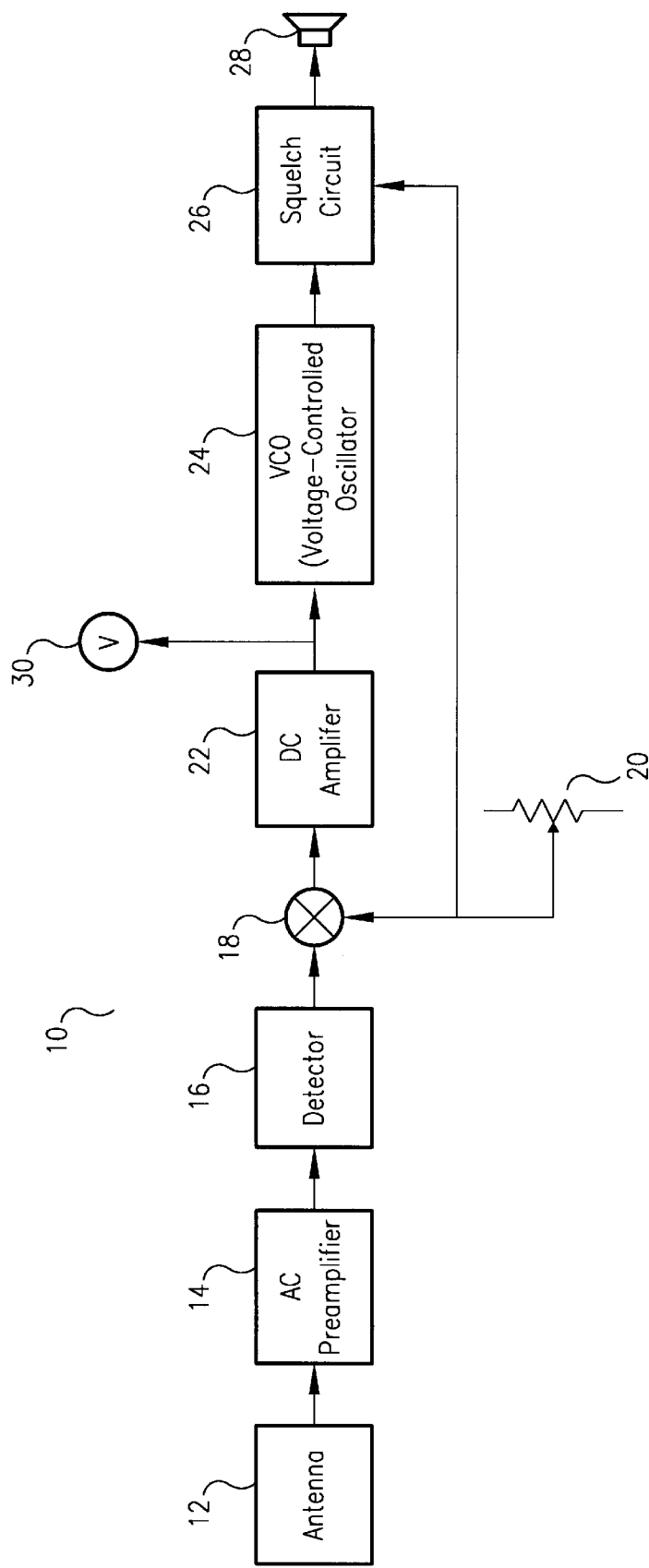
FIG. 1 is a functional block diagram of electro-magnetic field detection and measurement apparatus.

Referring to FIG. 1, a diagram of an electro-magnetic field detection and measurement apparatus 10 embodying the present invention is shown. The embodying described is particularly adapted for selfcontained portable operation.

Said apparatus receives input signal via antenna 12 that is a representation of a measured electro-magnetic field. Signal from said antenna then received by the input of AC preamplifier 14 that provides necessary gain for received weak signals. The signal at the output of said preamplifier is a replica of an input signal, magnified in amplitude. Output of said preamplifier is connected to the input of detector 16. Said detector rectifies alternatecurrent (AC) signal from said preamplifier and converts it into directcurrent (DC) voltage. This DC voltage is then combined in summing means 18 with the DC voltage from the leveladjusting means 20. Said leveladjusting means (in this particular implementation represented as a potentiometer that serves as a variable voltage divider for the DC supply voltage) provide variable manuallycontrolled DC voltage. The output of the summing means is a DC voltage that is a combination of the DC voltages from the detector and from the leveladjusting means. The user by operating leveladjusting means can set the output of the summing means at arbitrary value. Thus, the variations of DC voltage from the detector, as a function of various magnitude of the electro-magnetic field, can be centered around such set arbitrary voltage. The purpose of that will be explained in details later in the text.

The DC voltage from summing means is amplified by DC amplifier 22. The amplified voltage from the output of this amplifier controls the frequency of VoltageControlled Oscillator (VCO) 24. The higher the voltage at the input of the VCO, the higher the frequency at the output of the VCO. Thus, the stronger the electro-magnetic field, the higher the frequency of the VCO.

Output of the VCO passes the squelch circuit 26 and then drives speaker 28. Speaker produces audible signal that is a representation of the signal at the output of VCO. Thus, the higher the strength of the electro-magnetic field, the higher the pitch of the sound emitting from the speaker. The pitch of the sound is means of indicating the relative strength of the electro-magnetic field. Human ear is very sensitive to the pitch of sound. Therefore, user can detect the slightest changes in the field strength.

The magnitude of the measured electro-magnetic field can vary within a wide range. Without level adjustment the output frequency of VCO could be at either limit, making test results unusable. In order for the user to maintain workable measurement range, he or she can adjust leveladjustment means in such way that at any magnitude of the field strength within specified range the output frequency can be set at or near some predetermined frequency.

The squelch circuit is controlled by the voltage coming out of the DC amplifier. If the voltage at the output falls below preset value of the squelch circuit, the squelch circuit will disconnect the output of VCO from the speaker. Thus, the speaker will produce sound only when the field strength reaches or exceed preset level. It greatly simplifies search for highlevel emission sources.

Another means of indication of relative field strength is visual indicating means 30 connected to the output of said DC amplifier. In this particular embodiment visual indicating means are constructed as LED level bar (explained in details later in the text).

Figure 2:
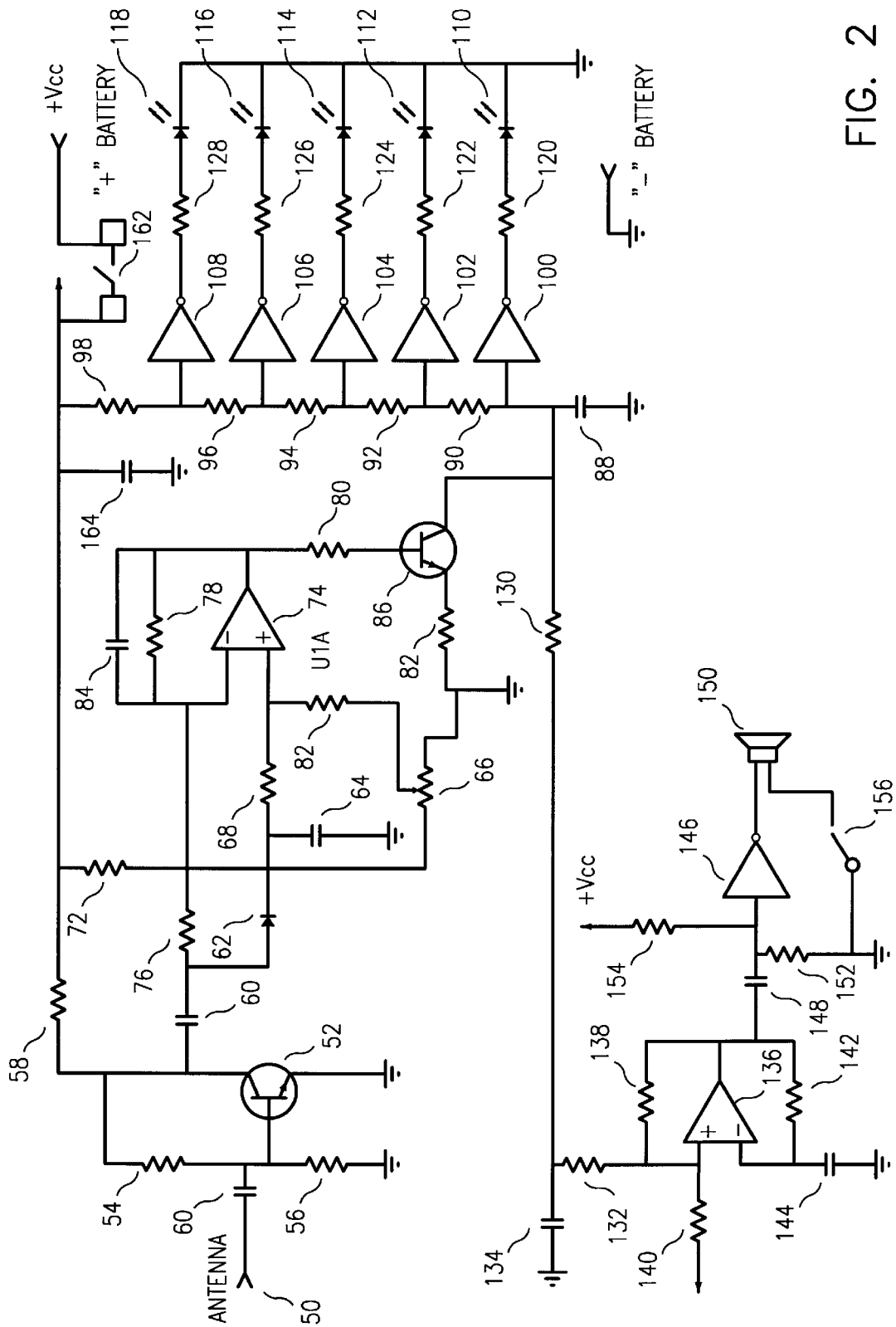
FIG. 2 is a circuit diagram of said apparatus.

Detailed schematic of the preferred embodiment is shown in FIG. 2. Antenna 50 provides signal to the input of the preamplifier built on transistor 52, resistors 54, 56, 58 and capacitor 60. Capacitor 60 blocks DC voltage between the output of said preamplifier and the halfwave rectifier built on diode 62 and capacitor 64.

Signal from said rectifier is being combined with the voltage from the voltagedividing potentiometer 66 via resistors 68 and 70. Said potentiometer 66 and rangelimiting resistor 72 act as a leveladjusting means. As the user changes the position of the wiper of the potentiometer 66, the DC voltage at this wiper changes accordingly, and the resulting voltage at the noninverting input of the operational amplifier 74 shifts.

Said operational amplifier 74, along with resistors 76, 78. 80 and 82, capacitor 84, and transistor 86 comprise DC amplifier that provides amplification for the signal from the output of said rectifier. The gain of said DC amplifier is adjusted by the ratio of resistors 78 and 76 and separately by resistor 82. Resistor 80 limits base current of transistor 86. Capacitors 84 and 88 block incidental ripples and undesirable highfrequency transient components of the rectified signal.

Collector load of transistor 86 consists of resistors 90, 92, 94, 96 and 98 that represent a voltage divider. The inputs of logic gates 100, 102, 104, 106 and 108, which in this particular application work as threshold detectors, are connected to said voltage divider.

In absence of the signal from the antenna, the output voltage of the rectifier is low and the voltage at the collector of the transistor 86 is equal or close to the supply voltage. All outputs of said gates are thus set to logic "0". As the signal at the antenna increases, transistor 86 opens, the voltage at its collector drops and said logic gates begin to change their state to "1" starting with the gate 100 of FIG. 2. The light-emitting diodes (LEDs) 100, 112, 114, 116 and 11 8 that are connected to the outputs of said gates via currentlimiting resistors 120,122, 124, 126 and 128, will be turning on accordingly.

As the voltage at the output of said DC amplifier rises, the voltage level at the inputs of said gates rises as well and the more logic gates change their state and switch to high output level that powers LEDs. Therefore, the stronger the measured field, the more LEDs are on. This provides visual indication of the field strength.

The proper ratio of values of resistors 90, 92, 94, 96 and 98 can determine the scale at which LEDs reflect the field strength. In this particular implementation, each LED represents approximately 1 dB of change in the field strength.

The LED bar has an advantage over the typical numerical display since it can react to the changes in the field strength in real time, while digital display typically refreshes two to three times in a second. Using LED bar, the user can scan the tested product and locate hot emission spots in seconds.

Further, the signal from the collector of said transistor 86 is applied via resistors 130 and 132 and capacitor 134 to the noninverting input of operational amplifier 136, which together with resistors 138, 140 and 142 and capacitor 144 comprises a voltage-controlled squarewave oscillator (VCO). The lower the voltage at the noninverting input of said operational amplifier 136, the higher the produced frequency. Capacitor 144 together with resistors 138 and 142 determine the starting frequency. In this particular implementation, the starting frequency is selected around 500 Hz and can go up to approximately 3000 Hz. Capacitor 134 and resistor 132 form a lowpass filter that filters out oscillated pulses from the VCO so that it does not affect operation of transistor 86 and said threshold detectors built on gates 100 through 108. Resistor 130 determines the frequency sweep range of the VCO.

The component values of said VCO are selected such that oscillations do not begin until the voltage at it control input (noninverting input of operational amplifier 136) drops to approximately ⅔ of the supply voltage. Thus, the oscillator has a squelch feature—it doesn't generate any tone until the measured field reaches certain strength. In this particular implementation, the squelch threshold is selected such that the first tone appears about at the same field strength level as first LED 110 turns on. Other ways of implementing a squelch function are also possible.

The operational amplifier 136 cannot feed speaker directly—its output stage is not powerful enough. Therefore, its output is AC coupled to the input of the inverter 146 via capacitor 148. Said inverter directly powers speaker 150. Resistors 152 and 154 provide such DC bias to the input of the inverter 146 so that in absence of signal from the VCO the output of the inverter is logic 0, or approximately, 0 V. This way, the inverter 146 does not have to feed speaker with the DC voltage in absence of the signal. Switch 156 disconnects the speaker if user prefers visualonly measurements.

Thus, the stronger the measured field, the higher the audio pitch produced. User can easily detect the slightest changes in the field strength without even looking at the display.

In this particular implementation the entire circuit is powered by the battery 160 and the power is turned on by depressing pushbutton switch 162. The user has to keep the switch depressed all the time the device is in use. This way the device will never be left in the powerup stage and the battery will not be discharged while the device is not in actual use.

Figure 3:
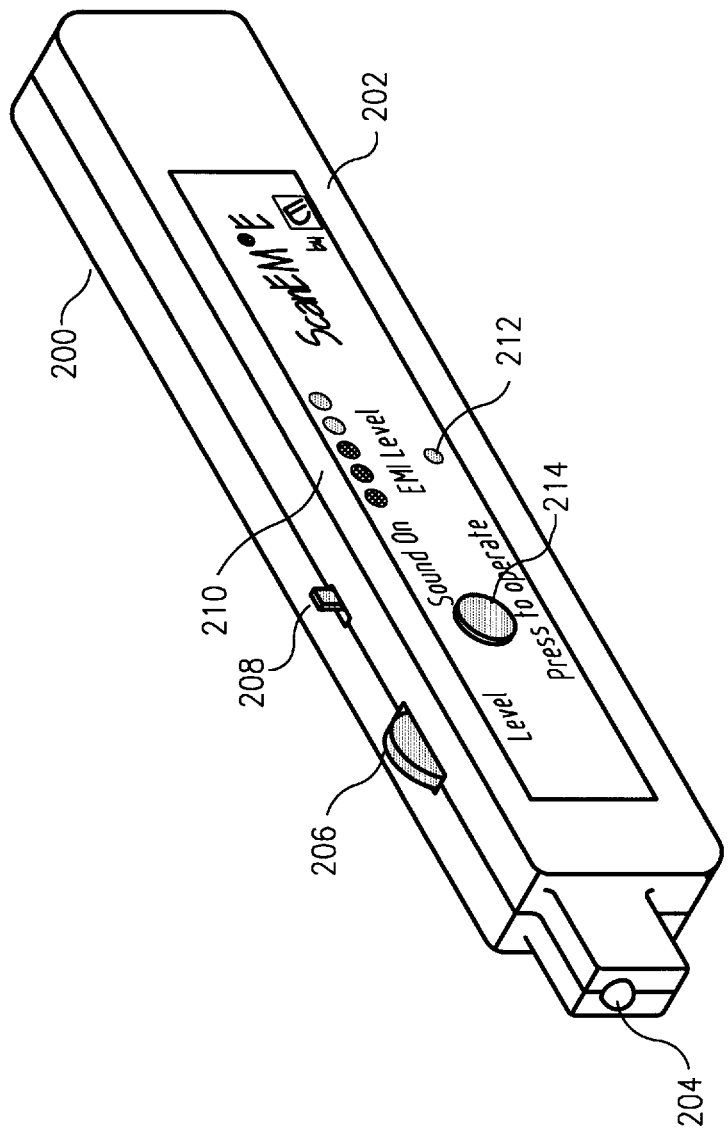
FIG. 3 illustrates physical implementation of said apparatus.

FIG. 3 depicts an actual implementation of the described invention. It needs to be mentioned that other implementations of this invention are possible and the one shown serves as an illustrative embodiment only.

An apparatus of invention 200 is shown here to be encapsulated in an enclosure 202. An antenna 204 is installed at the end of the apparatus so that is serves as the business end of it. Level control potentiometer 206 and speaker on/off switch 208 are placed on the top of the apparatus so the user can access them with his/her index finger. Row of LEDs is placed on the face surface of the apparatus. The opening 212 for the speaker and the power switch 214 are also located at the face surface of the apparatus.

Figure 4:
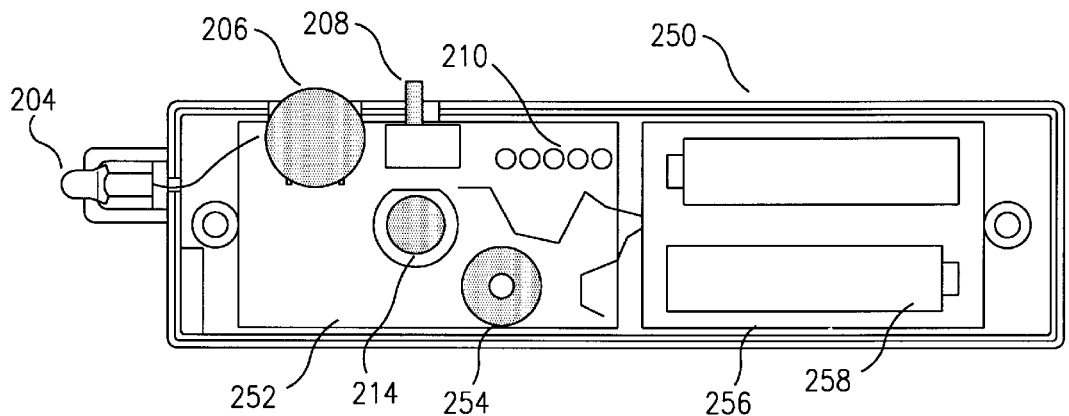
FIG. 4 shows preferred embodiment of said apparatus with the top lid off in order to show its physical implementation.

FIG. 4 shows said apparatus with the top half of the enclosure taken off The bottom half 250 of the enclosure houses printed circuit board assembly 252 that houses speaker 254 and said potentiometer 206, switches 208 and 214, LEDs 210. Said bottom half of the enclosure also contains battery holder 256 that houses batteries 258. An antenna 204 lays in a special recess and connects to said printed circuit assembly via wire 260.

Figure 5:
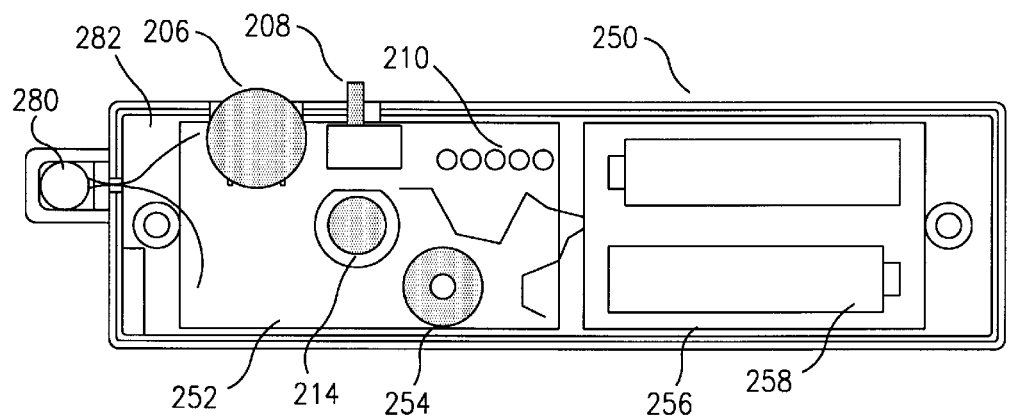
FIG. 5 shows preferred embodiment of said apparatus with the antenna for magnetic field measurements.

The antenna shown in FIGS. 3 and 4 is suited for receiving an electric field component (or, as commonly known in the industry, E-field) of the electro-magnetic field. It is a simple monopole antenna. Another type of antenna to receive a magnetic (Hfield) component of the electromagnetic field is shown in FIG. 5. As seen, instead of monopole antenna, it contains an inductive antenna 280 which is connected to the printed circuit board with wires 282. The operation of apparatus is the same regardless of the type of an antenna.

Figure 6:
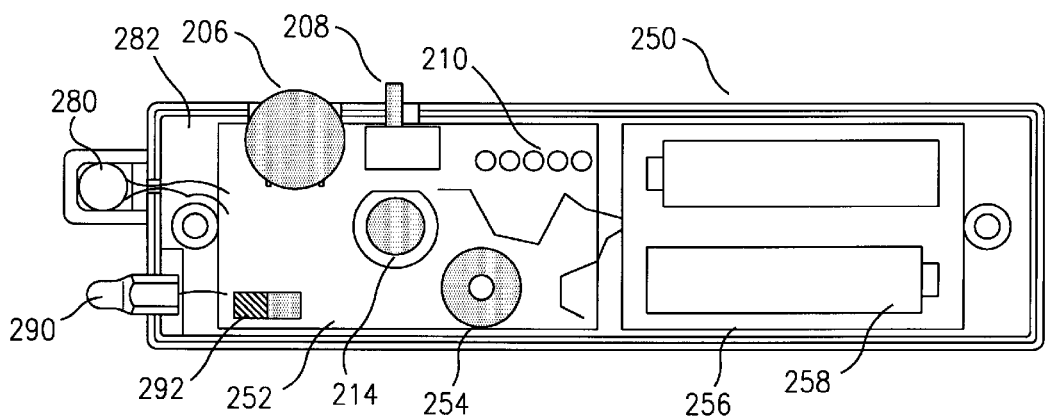
FIG. 6 illustrates construction of the apparatus with both antennae and a switch implemented.

FIG. 6 depicts yet another implementation of the invention where both magnetic (280) and electric (290) field antennae are combined in one unit and the switch 292 connecting input of said preamplifier to either electric or magnetic field antenna allows user to select which type of antenna to use. This way, only one apparatus is needed for complete field measurements.

While preferred embodiment described herein has visual indication means in a form of an LED level bar, additional or alternate means of visual indication, such as numeric display, etc., could be utilized.

The foregoing description has been of but one implementation of the invention. Many uses and modifications of the present invention will be apparent to those skilled in the art. It is, accordingly, the intention that the following claims cover all equivalent modifications and variations as fall within the scope of the invention.

I claim:

1. Hand-held apparatus for detecting and measuring the near-field strength of an electromagnetic field, said apparatus comprising:

receiving means for detecting and converting broad-band electromagnetic field radiation into alternating-current signals representing said broad-band electromagnetic field radiation;

signal conversion means, coupled to the receiving means, for converting said alternating-current signals into direct-current signals; and signal strength indicating means, coupled to the signal conversion means, for indicating the magnitude of the strength of said electromagnetic field radiation in response to said direct-current signals;

said signal strength indicating means including a voltage-controlled oscillator, having a reference voltage, for converting said direct-current signals having a magnitude greater than the reference voltage into an alternating-current signal having a frequency directly proportional to the magnitude of said broad-band electromagnetic field radiation.

2. Apparatus as in claim 1 wherein the signal strength indicating means further includes transducer means coupled to said voltage-controlled oscillator for producing an audible signal having variable pitch for representing variations in the magnitude of the strength of the electro magnetic field radiation in proportion to the pitch of the audible signal.

3. Apparatus as in claim 2 further including level adjustment means, coupled to said voltage-controlled oscillator, for adjusting the reference voltage for causing the frequency thereof to represent a preselected strength of the electromagnetic field radiation.

4. Apparatus as in claim 3 further including squelch means, coupled to the voltage-controlled oscillator, for inhibiting the transducer means from emitting said audible signal if the magnitude of said direct-current signal is below said reference voltage.

5. Apparatus as in claim 2 wherein a higher magnitude of the strength of the electromagnetic field radiation is indicated by a higher pitch audible signal.

6. Apparatus as in claim 1 further including visual indicating means, coupled to the signal converter means, having a plurality of light-emitting diodes for visually indicating the magnitude of the strength of the electromagnetic field radiation as a function of the direct-current signal.

7. Apparatus as in claim 6 wherein the visual indicating means also indicates variations in the magnitude of the strength of said electromagnetic field radiation.

8. Apparatus as in claim 6 wherein a higher magnitude of the strength of the electromagnetic field radiation is indicated by a higher number of powered light-emitting diodes of the plurality thereof.

9. Apparatus as in claim 1 wherein said receiving means includes an electric field antenna for receiving the electric field component of the electromagnetic field radiation.

10. Apparatus as in claim 1 wherein said receiving means includes an inductive antenna for receiving the magnetic field component of the electromagnetic field radiation.

11. Apparatus as in claim 1 wherein said receiving means includes an electric field antenna, an induction antenna, and switching means for selecting one of said electric field or induction antenna.

* * * * *